United States Patent [19]

Chuang et al.

[11] Patent Number: 4,890,260

[45] Date of Patent: Dec. 26, 1989

[54] CONTENT ADDRESSABLE MEMORY ARRAY WITH MASKABLE AND RESETTABLE BITS

[75] Inventors: Patrick T. Chuang; Robert L. Yau, both of Cupertino; Hiroshi Yoshida, Santa Clara; Moon-Yee Wang, Cupertino, all of Calif.

[73] Assignee: Advanced Micro Devices, Sunnyvale, Calif.

[21] Appl. No.: 193,312

[22] Filed: May 11, 1988

[51] Int. Cl.[4] ............................................. G11C 15/00
[52] U.S. Cl. ...................................................... 365/49
[58] Field of Search .......................................... 365/49

[56] References Cited

U.S. PATENT DOCUMENTS 4,670,858  6/1987  Almy ....................................... 365/49

Primary Examiner—Joseph A. Popek
Attorney, Agent, or Firm—Skjerven, Morrill, MacPherson, Franklin & Friel

[57] ABSTRACT

A content addressable memory array includes an array of M words containing bits configured in N bits for each word. One of the bits in each of the words is a settable skip bit, and during a search of the memory array, the array is examined to detect the presence therein of skip bits. If a skip bit is detected in any one of the words, that word containing the detected skip bit is eliminated from the search.

Each word in the array also contains an empty bit which is used to indicate an empty word location in the array. When all empty bits are set, the array is automatically reset to empty or zero.

5 Claims, 4 Drawing Sheets

CONTENT ADDRESSABLE MEMORY ARRAY WITH MASKABLE AND RESETTABLE BITS

CROSS-REFERENCE TO RELATED APPLICATIONS

Copending application, Ser. No. 07/193,308, filed concurrently herewith (M-702) and assigned to the same assignee as the present application, has claims directed to a content addressable memory having the multiplexing address instructions and flag information disclosed herein.

Copending application, Ser. No. 07/193.315, filed concurrently herewith (M-703) and assigned to the same assignee as the present application, has claims directed to the architecture of the content addressable memory system disclosed herein.

BACKGROUND OF THE INVENTION

1. Field of the Invention

This application relates to systems employing content addressable memory (CAM) arrays in which a memory is searched on the basis of the contents of the memory data rather than by the data location in the memory.

2. Description of the Prior Art

The conventional or von Neumann-type computers, and especially those using principles of addressing computational variables by the indices of their locations, have frequently been regarded as unsatisfactory in large problems. Many attempts have been made to replace the conventional random-access memories by structures from which the operands could be called out by their symbolic names or data contents, and possibly many operands at a time. The high-level algorithmic and problem-oriented languages might take significant advantage of such a feature. There exist at least two reasons for which development in this direction has not been particularly rapid. One of them is the much higher price of content-addressable memories compared to the random-access memories. Another reason is that the problem of encoding the variables symbolically already has effective software solutions which do not require special memories. This, however, does not bring about the other feature which would be very desirable in large problems, namely, retrieving of a great number of variables from the memory simultaneously.

While associations were originally considered for the description of interrelations or cross references between pieces of information only, it has later turned out that searching of data by its partial content can effectively be utilized in the manipulation of arithmetic algorithms. Such content addressing can be made in a highly parallel fashion, i.e., simultaneously over a great number of data elements, usually at a rather low level, referring to transformations that occur in the binary representations. The problem of parallel computation has also another direction where content-addressability is used to control higher-level algorithmic functions in parallel.

The following definitions may be employed in connection with the subject matter of the present invention.

Content-addressable memory: a storage device that stores data in a number of cells. The cells can be accessed or loaded on the basis of their contents.

Content-addressable processor: a content-addressable memory in which more sophisticated data transformations can be performed on the contents of a number of cells selected according to the contents, or a computer or computer system that uses such memory as an essential component for storage or processing, respectively.

Accessing data on the basis of their content always involves some comparison of an external search argument with part or all of the information stored in all cells. Whether this is done by software, mechanical scanning or parallel electronic circuits, is immaterial in principle; however, a "genuine" content-addressable memory performs all comparisons in parallel. Another fact to emphasize is that comparison by equality match between the search argument and the stored item is not the only mode used. If the stored data have numerical values, the purpose of content-addressable search may be to locate all cells the contents of which satisfy certain magnitude relations with respect to the search arguments; for instance, being greater than or less than the given limit, or between two specified limits. Content-addressable searching is sometimes performed without reference to an external search argument, for instance, when locating the maximum or minimum in a set of stored numbers.

Hardware content-addressable memories have been used as special parts in computing systems, in certain organizational solutions whereby the CAMs can effectively perform fast buffering, checking, and bookkeeping operations needed in the moving and rearrangement of data. In this way the CAM devices can effectively contribute to the speed of usual operations by making the operands more directly available to the processing circuits.

In a masked search in a CAM array, only a subset of the bits of a search-argument word is compared with respective bits of all memory words. Masking in the CAM usually means masking out, or disablement of certain bits. Those stored words which agree in the specified (unmasked) bit positions with the search argument are then read out.

SUMMARY OF THE PRESENT INVENTION

Utilizing prior art techniques, providing a CAM array package having a configuration with N bit wide words and M words deep (for example, 48 bit words, with 256 words in the array) and operating in a nonmultiplexed mode would require a large number of pins on the package to provide the data, control, flag and power supply signals necessary. For example, the following pin count would be needed for a typical nonmultiplexed 256 by 48 CAM array using prior art techniques.

| | |
|---|---|
| Address in | - 8 pins |
| Encoded Address Out | - 8 pins |
| CAM Data I/O | - 48 pins |
| Match Data In (Unmasked) | - 48 pins |
| Match Data In (Mask Bits) | - 48 pins |
| Control Signals | - 3 pins |
| Status Flags (Match, Full, Multiple Match) | - 3 pins |
| Power supplies, assuming one Vcc and Vss pair for every 8 outputs, one pair for circuit, and one pair for input- | - 16 pins |
| Total | 182 pins |

In accordance with the present invention, by time multiplexing the 48 data bits onto a 16 bit bus using three memory cycles, a substantial reduction can be realized in the number of required package pins. To accomplish this, the invention employs three 48 bit internal registers to hold the CAM data, the unmasked match word and the mask bits. These three 48 bit registers can be loaded in three cycles from the 16 bit I/O bus. In addition to a data write cycle and a data read cycle, a command write cycle and a status read cycle are utilized in this invention to further multiplex the address, instructions and flag information to and from the 16 bit bus. This latter is done at the expense of an extra control signal (D/$\overline{C}$Data/Command). During a command write cycle, the write command takes on the format of a command word, with operational (OP) codes encoded in some of the word bits and addresses information encoded in others of the bits. During a status read operation, information as to flag status is encoded in part of the status word bits and address information is encoded in other of the status word bits. This ability to utilize the command write and status read information so as to enable its placement on the 16 bit bus using multiplexing techniques is an important feature of the present invention.

Using the teachings of the present invention in multiplexing information, the required pin count is reduced to the following:

| | |
|---|---|
| I/O | - 16 pins |
| Control Signals | - 4 pins |
| Flags (Match; full) | - 2 pins |
| Power supplies (fewer Vcc and Vss pairs are required for the output) | - 6 pins |
| Total | 28 pins |

In accordance with another important aspect of the present invention, a CAM array is provided in which any or all of the bits in a word can be maskable and any or all of the words in the array can be both maskable and resettable.

A further feature of this invention is the particular CAM processor architecture employed. This architecture involves the following structure:

1. CAM Cell Array.

An array of CAM cells is arranged in the desired organization Word lines and match lines run in the same direction, and bit lines run perpendicular to the word lines.

2. Row Decoder.

A one out of M decoder selects only the desired word.

3. Bit Line Precharge Circuit.

This precharges the bit lines to the optimum levels for high speed nondestructive cell reading.

4. Bit Line Descriptor Circuit.

One descriptor is provided for each associated bit, (i.e., one for each bit line pair). It consists of a mask register, a comparand register, a sense amp and a programmable bit line writing circuit.

Data can be written into the CAM cell through the bit lines with the word line selected The comparand register programs the programmable bit line writing circuit with the data to be written onto the bit lines and into the cell. Data can be read from the CAM cell through the bit lines with the word line selected. The cell signal on the bit lines is amplified by the sense amplifier.

A nondestructive parallel search (match) can be performed to the whole array with all word lines deselected. Data in the comparand registers and the mask registers is used to program the programmable bit line writing circuits. During the match operation, CAM cell data will be compared simultaneously with the data presented on the associated bit line pairs.

Data in the mask register can be used for programmable bit masking. A logic "1" in the mask register will overwrite the data in the comparand register, whereas a logic "0" in the mask register will allow the corresponding data in the comparand register to appear on the bit line for writing in a cell. Any or all of the bits can be masked in this manner.

5. Word Masking and Reset Circuit.

One is provided for each associated word and it consists of a skip bit and an empty bit. Any or all of the words can be masked out by the skip or empty bit. The entire array can be reset by resetting all the empty bits (set all empty). Data can be transferred into or out of these skip and empty bits through the data bus.

6. Match Detector

This detects a "no match", "single match" or a "multiple match" condition and can detect a chip "full" or chip "empty" condition. "Full", "match" and "multiple match" flags are available on the 16 bit bus.

7. Priority Encoder

In the case of a single or multiple match condition, the address of the highest priority match location will be encoded. In the case of a "no match" condition, the address of the highest priority empty location will be encoded.

8. Control Logic.

Instructions received from the 16 bit bus will generate internal timings to accomplish different operations.

9. 16 Bit Bus Multiplexed to providing the following:
Address bus for the row decoder.
Data I/O for the CAM cell.
Data I/O for match word (comparand register and mask register).
Data I/O for skip and empty bits.
Instructions for control logic.
Output flags for "full", "match" and "multiple match".
Encoded address of either "match" or "empty" locations from the priority encoder.

DESCRIPTION OF THE PREFERRED EMBODIMENT

Figure 1:
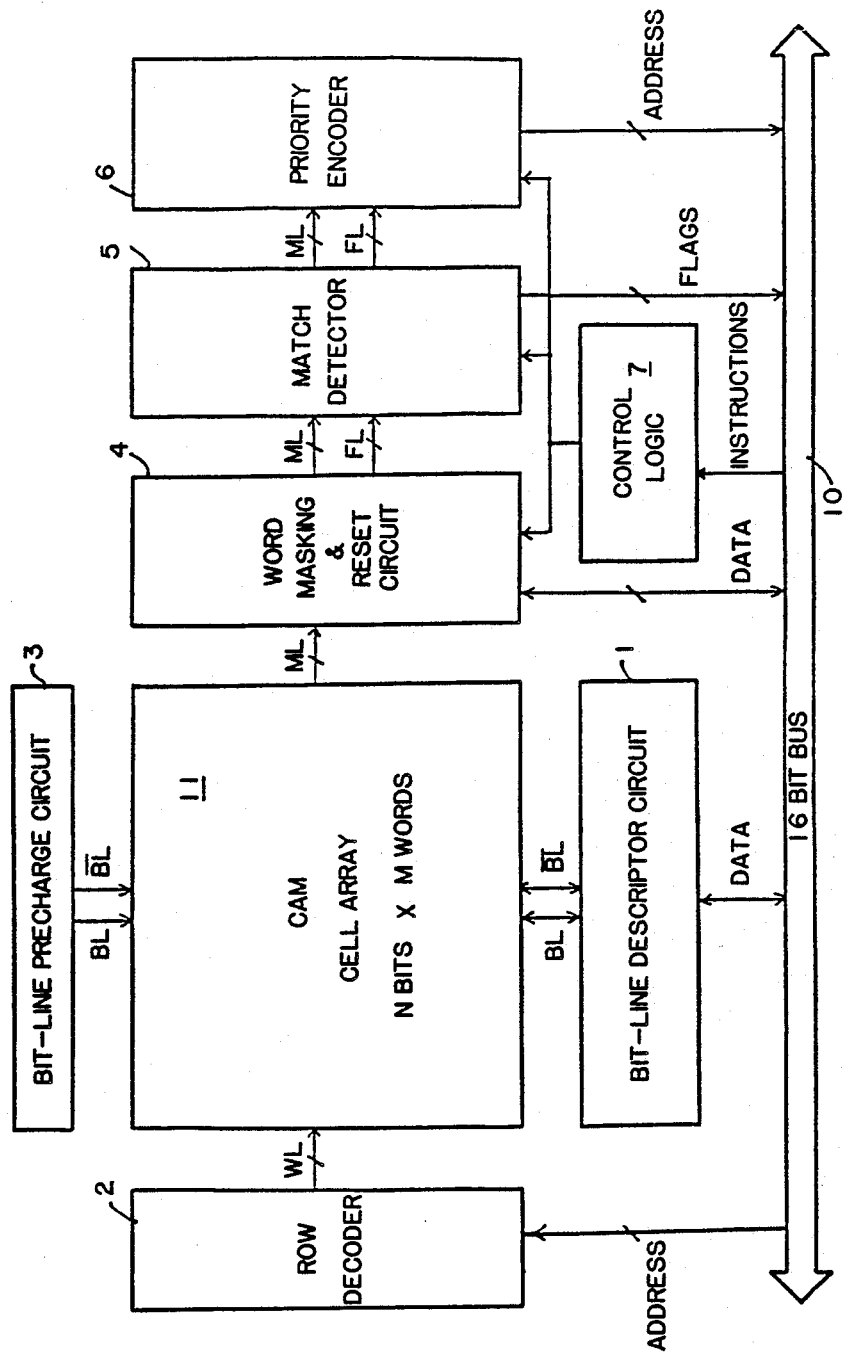
FIG. 1 is a functional block diagram showing the elements of present invention.

Referring to FIG. 1 the CAM cell array 11 of the present invention is organized in N-bit wide words and M words deep. A typical, but not limiting, example comprises an array of 48 bit words, with 256 such words in the array. Two extra bits (skip bit and empty bit) are attached to each word for word masking and reset purposes. Connected to each bit in the array through lines BL and, $\overline{BL0}$ is a bit line descriptor circuit 1 (shown in more detail in FIG. 2) which includes a programmable bit line writing circuit, a comparand register, a mask register, and a sense amplifier. Descriptor circuitry 1 exchanges data with a 16 bit bus 10. A row decoder 2 is connected to array 11 through a bus containing a plurality of word lines WL for selecting different words in the array. A bit-line precharge circuit 3 is connected to array 11 through a plurality of bit lines BL and $\overline{BL}$ a pair of such bit lines being provided for each column of bits in the array. Communicating with the output of array 11 through match lines ML are a word masking and reset circuit 4, a match detector 5 and a priority encoder 6. A control logic network 7 provides inputs to circuits 4, 5 and 6 in response to instructions received from bus 10. Circuits 4, 5 and 6 communicate directly with bus 10, the communication between bus 10 and circuit 4 being bidirectional. The details of these circuits are shown in more detail in FIG. 2.

Figures 1, 2:
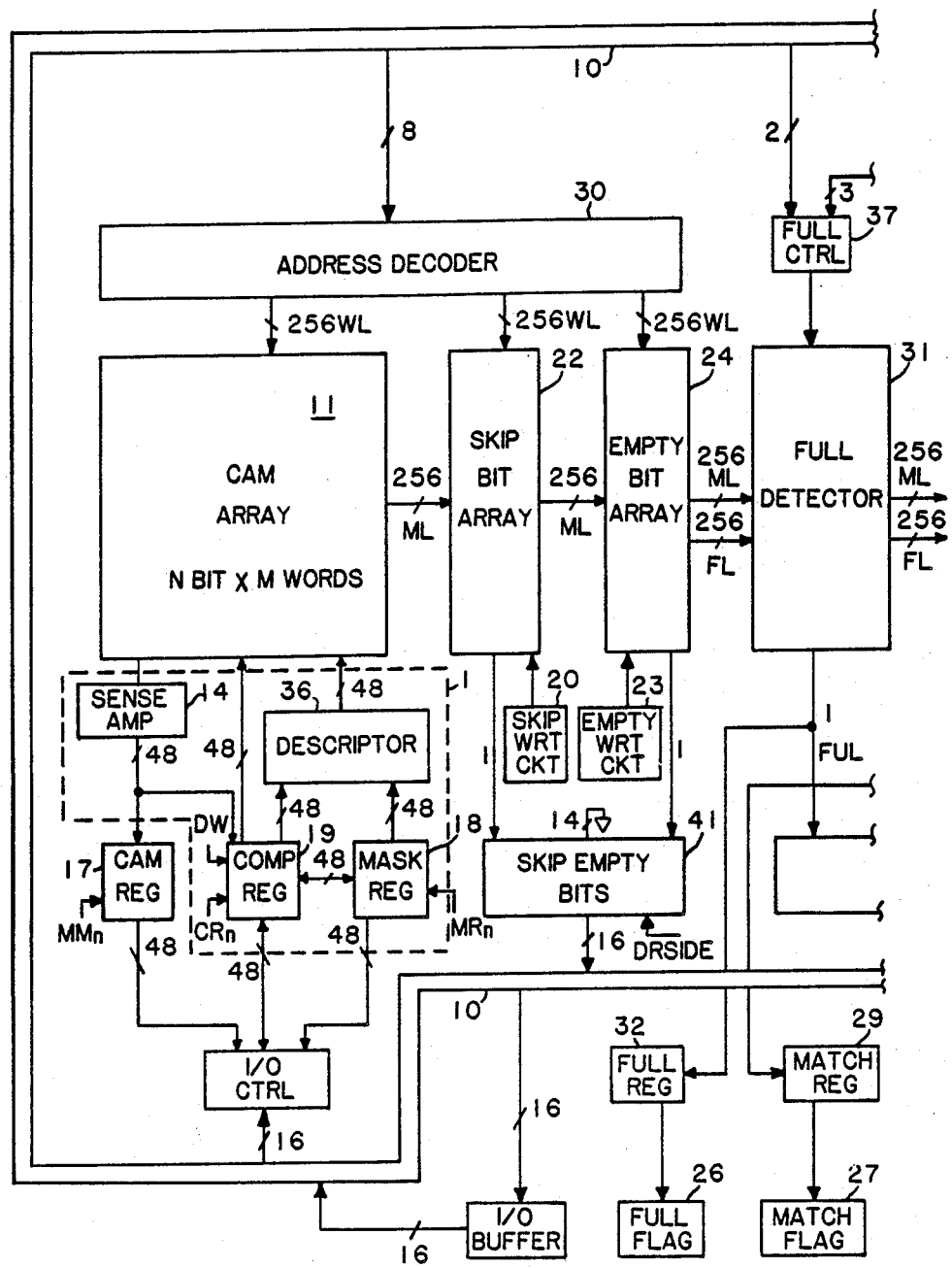
FIG. 2 is a block diagram showing additional details of the configuration of a CAM array processor in accordance with the present invention.
Figure 2:
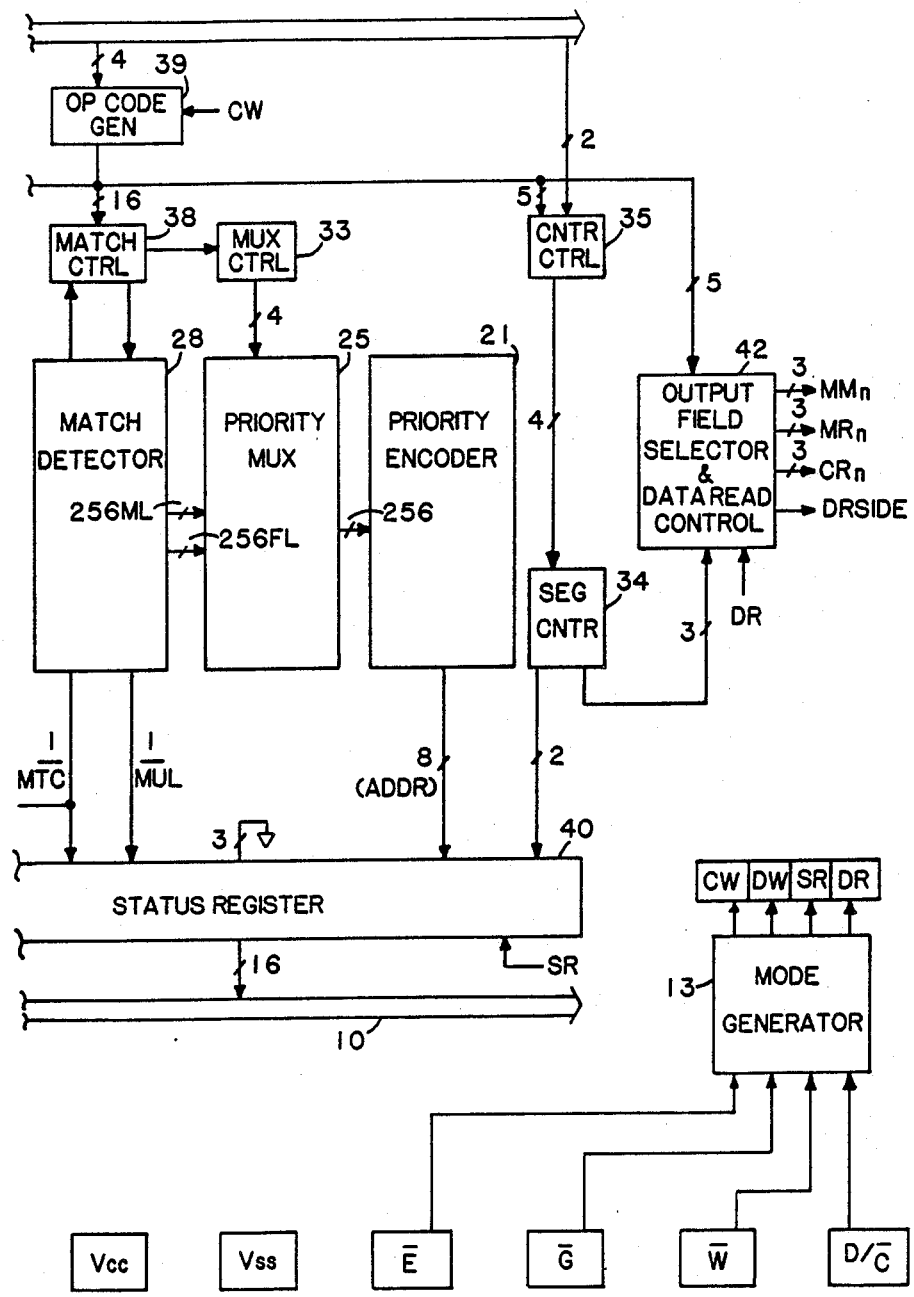

The most important feature of the overall architecture of the CAM system in accordance with the present invention are shown in FIG. 2. The elements of bit-line descriptor circuitry 1 from FIG. 1 are shown in the dotted enclosure 1 and include a CAM register 17, a mask register 18, a comparand register 19, a sense amplifier 14 and a programmable bit line writing circuit included in a descriptor element 36.

The circuit of FIG. 2 also shows an address decoder 30 corresponding in function to row decoder 2 of FIG. 1 to decode the eight address bits supplied from bus 10 to identify the one of the 256 words in array 11 to be selected. Also shown connected to the output of array 11 and to decoder 30 are a skip bit array 22 having a skip write circuit 20, and an empty bit array 24 having an empty write circuit 23. Outputs from elements 22 and 24 are supplied to skip/empty bits element 41.

Also shown in FIG. 2 are a full detector 31 controlled by a full control element 37 and supplying an output to a status register 40 and to a full register 32. Status register 40 communicates in a 16 bit manner with bus 10 during a status read operation.

A match detector 28 controlled by a match control element 38 supplies a single match signal to a match register 29. Signals from full register 32 and match register 29 are supplied to full flag element 26 and match flag element 27, respectively Match detector 28 also supplies both the single match signal and a multiple match signal to status register 40.

FIG. 2 also shows a priority multiplexor 25 which multiplexes the information from elements 28 and 31 to a priority encoder under the control of a multiplexor control element 33. A segment counter 34 is under the control of a counter control element 35 which is connected to bus 10 and to the output of OP code generator 39. Counter 34 supplies one input to status register 40 and another output to an output field selector and data read element 42.

The system of the present invention has four modes of operation, which are command write (CW), data write (DW), status read (SR), and data read (DR), as shown by the corresponding blocks on the output of a mode generator 13 in FIG. 2. In the data write mode, data is written into the comparand register. Mode generator 13 receives a chip enable signal on a pin $\overline{E0}$ an output enable signal on a pin $\overline{G0}$ a write enable signal on a pin $\overline{W0}$ and a command/data signal on a pin D/$\overline{C0}$ Comparand register 19 is the main buffer between bus 10 and CAM array 11. After a data write operation is performed, one of the operation (OP) codes is carried out under the control of the command write cycle to move data into CAM array 11 or mask register 17.

Under the command write cycle the command write instruction is encoded on the 16 bit bus 10. Of the 16 bits on bus 10, 4 bits are used to decode the 16 OP codes employed in the present invention. There are also 8 bits on bus 10 for the address location to indicate to which location in array 11 the data is to be transferred from comparand register 19. The OP codes employed in the present invention are listed below.

Op Code 0  Initialization
All Skip-bits are set to LOW (don't skip) and all Empty-bits are set to HIGH (empty). The /MTCH and /FULL outputs are enabled. The mode is set to 48-bit mode. The Mask register and Segment counter are reset to zero. By default, subsequent data writes and reads are to and from the comparand register
Op Code 1  Output control
Match and full flags are enabled or disabled by this command.
Op Code 2  Mode select
User can use this command to select between 16 or 48 bit mode. In 16-bit mode, the Segment counter is never incremented.
Op Code 3  Move Comparand Register to Mask Register
Contents of the Comparand register data is moved into the Mask register.
Op Code 4  Move Mask Register to Comparand Register
Contents of the Mask register data is moved into the comparand register.
Op Code 5  Enable Output from Skip and Empty Bit Array to I/O port
All subsequent data mode reads result in data flowing from Empty-bits and Skip-bits to the output buffer. Address is specified by the command register address field.
Op Code 6  Move Comparand Register to CAM
Contents of the Comparand register data is moved into the CAM. The Empty-bit and Skip-bit are not changed. The CAM address is specified by the command word address field. The Segment counter is not changed.
Op Code 7  Move CAM to Comparand Register
Contents of the CAM data specified by the command word address field is moved into the Comparand register. The Segment counter is not changed. The Skip and Empty Bit Array information is not changed.
Op Code 8  Reserved
Op Code 9  Skip-bit control
User can write to Skip-bit array using this command. They can write the whole array in one cycle or any individual bit by providing the desired address location.
Op Code 10  Empty-bit control
User can write to Empty-bit array using this command. They can write the whole array in one cycle or any individual bit by providing the desired address location
Op Code 11  Enable Output from Comparand Register to I/O Port
All subsequent data reads result in data flowing from the Comparand register segment to the output buffer.
Op Code 12  Enable Output from Mask Register to I/O port
All subsequent data reads result in data flowing from the Mask register segment to the output buffer.
Op Code 13  Enable Output from CAM to I/O port
All subsequent data reads result in data flowing from the CAM segment to the output buffer. CAM address is specified by the command word address field.
Op Code 14  Move Comparand Register to CAM
(Reset Empty bit and Skip bit both LOW)
Contents of the comparand register data is moved into address specified by the command word address field (CAM address). The corresponding Empty bit and Skip bit are both reset to LOW.
Op Code 15  Load Segment Counter
User can change the segment counter to get to any one of the 3 segments.

These 16 OP-code instructions are encoded by 4 high order bits of a command word on the 16 bit bus. A typical command word looks like:

$D_{15}$ $D_{14}$ $D_{13}$ $D_{12}$ $D_{11}$ $D_{10}$ $D_9$ $D_8$ $D_7$ $D_6$ $D_5$ $D_4$ $D_3$ $D_2$ $D_1$ $D_0$

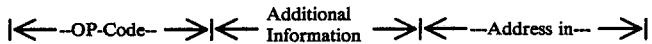

A status read is normally an operation following a match operation where the user wants to know the match location, whether it's a multiple or single match, and if the chip is still full. The contents of status register 30 can be read out onto bus 10. Two bits can be read from segment counter 22, eight bits from the address position indication from priority encoder 21 and three flag bits from full detector 31 and from the match and multiple match detector 28.

The status word employed in the present invention can be described as follows As shown below, the lower eight bit of the status word are the encoded address to indicate to the user the location.

$D_{15}D_{14}D_{13}$    $D_{12}D_{11}D_{10}D_9D_8$    $D_7D_6D_5D_4D_3D_2D_1D_0$

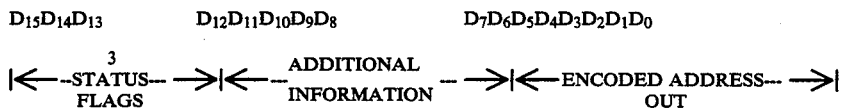

TYPICAL STATUS WORD

The upper three bits identify the status flags, including a multiple match flag, a full flag and a match flag. These internal flags should be like the external ones, but if outputs are not enabled, the flags will be high.

Data Read is a read operation where the user can obtain information from CAM register 17, from compare register 19, from mask register 18 or from the skip and empty bit information from memory 41. Hence, a Data Read operation will read information from one of the four registers depending on the previous command write cycle.

Two status bits are employed with each word in the present invention; one is a skip bit and the other is termed an empty bit. The skip bit is employed to enable the user to mask out a word and the empty bit is used in connection with empty bit locations in the array.

The invention employs a priority encoder 21 to provide an indication of the highest priority address location. For a match operation where a whole array compare is performed, this feature will provide an indication of the match location if there is a match. If there is not a match, the priority encoder 21 will point to the next empty address available for use. Under the multiple match condition in which there are more than 1 match locations the user can mask out, word by word until he can identify all locations having matched, this being the function of the skip bit represented by skip bit circuitry 20 and the skip bit array 22. Another bit employed herein is the empty bit, represented by empty write circuitry 23 and empty bit array 24. The empty bit has two states, one of which is empty and the other is full. The particular word location is used so that the user can set the empty bit to show that this particular bit location is occupied. Thus, when the user wants to write into the CAM cell he will know that some of the locations therein already have data in them.

Segment counter 22 keeps track of the internal segments so that the 16 bit bus 10 can be used for a 48 bit operation. At the start of a 16 bit mode operation the segment count in counter 22 is always set to the first count. However, there is also a user programmable feature by which the user can advance to the second segment count or the third segment count by using OP codes 15, described above.

There are two external flags, one of which is the "full" flag, represented by element 26, and the other is the "match" flag, represented by element 27. If there is a match in the array, as detected by match detector 28 and communicated through match register 29 to flag 27, the match flag will go low. Similarly, if all the locations in array 11 are full, as detected by full detector 31 and communicated through full register 32, to flag 26, the full flag will go low. When the full flag 26 is high, this means there are still empty locations in array 11 for the user, and when the match flag 27 remains high, this means there is no match.

Signals from both the match line and the full line go into the priority encoder 21 through priority multiplexer 51 (FIG. 1). If there is no match, the empty location will be decoded as well. Both the empty information and the match information are supplied to priority encoder 21. Full detector 31 will detect whether the array is full or empty.

Match detector 28 detects a match or no match condition, whereas priority encoder 21 provides the address location of the match word. Priority encoder multiplexer 51 will multiplex the empty and the match location information, so that one of the two will be coming into encoder 21.

Figure 3:
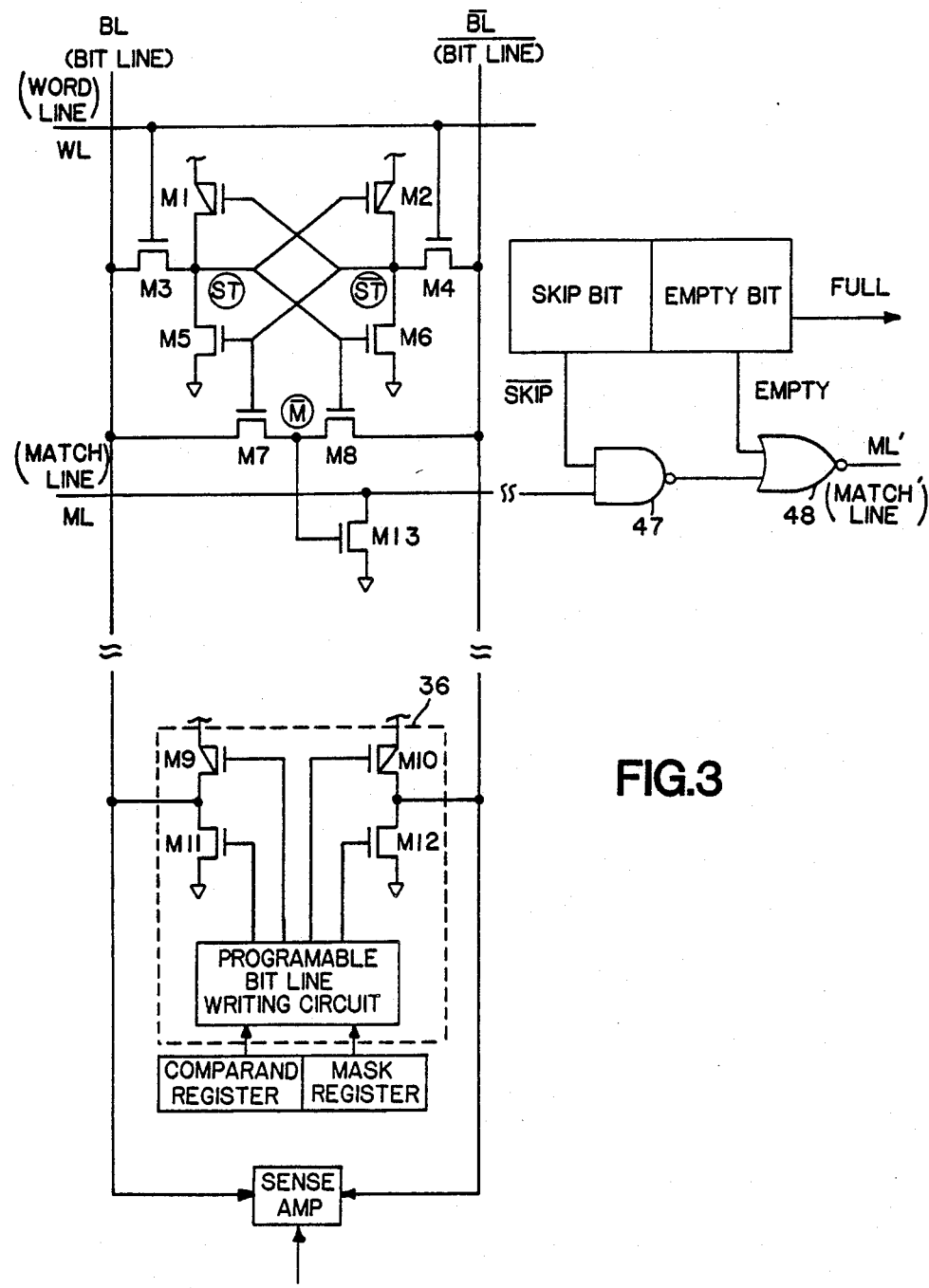
FIG. 3 is a diagram showing a portion of the logic employed in the invention for word masking and word or array resetting.

Referring to FIG. 3, a nine transistor cell is shown of which transistors M1, M2, M5, M6 are the basic storage elements, the cross coupled pairs. Nodes ST and are the storage nodes and transistors M3, M4 are the access transistors which connect the storage nodes to the bit line pair B1 and. Cell access is controlled by the word line selection through WL. Transistors M7, M8 are the match transistors. They are connected in an exclusive NOR configuration where storage nodes ST, and bit line pair BL, are the inputs and match node is the output. When the cell data is equal to that on the bit line, a logic low appears on.

MATCH CONDITION

When all N bits in the same word have matching data on their respective bit line pairs, a match condition occurs. Since all the cell match nodes are at logic low, none of the pull down transistors M13 on the match line can be turned on. Therefore, the match line will remain at a logic high. In contrast, any nonmatch condition will result in the match line being pulled low.

BIT MASKING

When both B1 and are set low by the transistors M11 and M12, match node will be low regardless of the CAM cell data. Therefore, this particular bit will be forced match. The bit masking condition can be accomplished by setting the mask register 18 to "1" (to force both BL, and low). When the mask register is set to "0", data in register 19 can appear on the bit line pair.

WORD MASKING

Word masking can be accomplished by setting either the skip or/and the empty bit high. In either case, the final match line output (ML') will be forced low through the NAND gate (47) and NOR gate (48) indicating a nonmatch condition even if there is a match.

ARRAY RESET

When all empty bits are set high, all M words are set empty and are available for new data.

We claim:

1. A content addressable memory array comprising an array of M words, each word containing bits configured in N bits for each word,
   a first one of said bits in each of said words being a settable skip bit;
   means for searching said array on the basis of the contents of said words to locate selected words;
   a second one of said bits in each of said words being a settable empty bit;
   means for setting selected ones of said skip bits to a skip condition;
   means for examining each of said words to detect the presence therein of a set skip bit therein;
   means for setting selected ones of said empty bits to an empty condition;
   means for examining said each of said words to detect the presence therein of a set empty bit therein; and
   means responsive to detection of one of said skip bits in any of said words for eliminating any of said words containing said detected skip bit from said search.

2. A memory array in accordance with claim 1 including means for setting said skip bit in selected ones of said words at a predetermined first value to cause said skip bit examining means to skip searching those word locations having said skip bit set at said predetermined first value.

3. A memory array in accordance with claim 1 including means for setting said empty bit in selected ones of said words at a predetermined first value to cause said empty bit examining means to skip searching those word locations having said empty bit set at said predetermined first value.

4. A memory array in accordance with claim 1 including means for setting all of said empty bits in each of said words to a first predetermined value to empty all of said words in said memory array to reset said array to an empty condition.

5. A memory array in accordance with claim 1 including means for setting said empty bit in selected ones of said word to a first predetermined value to cause said empty bit examining means to empty said bits in those of said words in which said empty bit has said first predetermined value.

* * * * *